(12) United States Patent
Yu

(10) Patent No.: US 11,961,841 B2
(45) Date of Patent: Apr. 16, 2024

(54) DISPLAY PANEL

(71) Applicant: TCL China Star Optoelectronics Technology Co., Ltd., Guangdong (CN)

(72) Inventor: Xiaoping Yu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 774 days.

(21) Appl. No.: 17/051,285

(22) PCT Filed: Mar. 17, 2020

(86) PCT No.: PCT/CN2020/079576
§ 371 (c)(1),
(2) Date: Oct. 28, 2020

(87) PCT Pub. No.: WO2021/159578
PCT Pub. Date: Aug. 19, 2021

(65) Prior Publication Data
US 2023/0143351 A1    May 11, 2023

(30) Foreign Application Priority Data
Feb. 10, 2020 (CN) .......................... 202010085057.1

(51) Int. Cl.
*H01L 27/12* (2006.01)
*H10K 59/126* (2023.01)

(52) U.S. Cl.
CPC ................ *H01L 27/1218* (2013.01)

(58) Field of Classification Search
CPC ............... H01L 27/1218; H01L 27/124; H01L 27/1288; H01L 21/76805; H01L 21/76886; H10K 59/126
See application file for complete search history.

(56) References Cited

U.S. PATENT DOCUMENTS

| 6,057,587 A | 5/2000 | Ghandehari et al. |
| 2017/0186831 A1* | 6/2017 | Nam .................... H10K 50/814 |

(Continued)

FOREIGN PATENT DOCUMENTS

| CN | 102543846 | 7/2012 |
| CN | 102629609 | 8/2012 |

(Continued)

OTHER PUBLICATIONS

International Search Report and the Written Opinion dated Nov. 3, 2020 From the International Searching Authority Re. Application No. PCT/CN2020/079576 and Its Translation Into English. (12 Pages).

(Continued)

*Primary Examiner* — Mohsen Ahmadi

(57) ABSTRACT

A display panel provided in embodiments of the present disclosure comprises a substrate, at least one metal layer, a darkening layer, and a functional layer, wherein the at least one metal layer is disposed on the substrate, the darkening layer covers the at least one metal layer, and the functional layer covers the darkening layer. An adhesive force of a photoresist to the functional layer is greater than an adhesive force of the photoresist to the darkening layer, and an adhesive force of the functional layer to the darkening layer is greater than the adhesive force of the photoresist to the darkening layer.

11 Claims, 3 Drawing Sheets

(56) References Cited

U.S. PATENT DOCUMENTS

| | | | | |
|---|---|---|---|---|
| 2019/0221782 A1* | 7/2019 | Sun | ........................ | H10K 71/00 |
| 2020/0174605 A1* | 6/2020 | Tang | ..................... | G06F 3/0445 |
| 2021/0066414 A1* | 3/2021 | Wang | ................... | H10K 50/856 |

FOREIGN PATENT DOCUMENTS

| | | |
|---|---|---|
| CN | 104603886 | 5/2015 |
| CN | 105529301 | 4/2016 |
| CN | 106784013 | 5/2017 |
| CN | 106972026 | 7/2017 |
| CN | 107968096 | 4/2018 |
| CN | 110463349 | 11/2019 |
| JP | 2015-153902 | 8/2015 |
| KR | 10-2009-0068463 | 6/2009 |

OTHER PUBLICATIONS

Notification of Office Action and Search Report dated Jan. 3, 2023 From the State Intellectual Property Office of the People's Republic of China Re. Application No. 202010085057.1 and Its Translation Into English. (15 Pages).

* cited by examiner

DISPLAY PANEL

RELATED APPLICATIONS

This application is a National Phase of PCT Patent Application No. PCT/CN2020/079576 having International filing date of Mar. 17, 2020, which claims the benefit of priority of Chinese Patent Application No. 202010085057.1 filed on Feb. 10, 2020. The contents of the above applications are all incorporated by reference as if fully set forth herein in their entirety.

FIELD AND BACKGROUND OF THE INVENTION

The present disclosure relates to the display technology field, and in particular, to a display panel.

To reduce reflectivity of a display panel, a darkening layer can be added on a surface of a metal. In general, material of the darkening layer is metal oxynitride. In order to achieve patterning, a photoresist is coated on a surface of the darkening layer. Usually, the photoresist has a good adhesive force to a surface of a metal, especially copper, but a poor adhesive force to the surface of the darkening layer. During a photoetching process, the photoresist is used for two wet etching and two dry etching processes. The poor adhesive force will cause the photoresist to peel off during a second wet etching process, resulting in abnormal display.

SUMMARY OF THE INVENTION

Embodiments of the present disclosure provide a display panel to solve a technical problem of the poor adhesive force between the photoresist and the darkening layer of the existing display panel during manufacture.

An embodiment of the present disclosure provides a display panel comprising a substrate, at least one metal layer disposed on the substrate, a darkening layer covering the at least one metal layer, and a functional layer covering the darkening layer, wherein an adhesive force of a photoresist to the functional layer is greater than an adhesive force of the photoresist to the darkening layer and an adhesive force of the functional layer to the darkening layer is greater than the adhesive force of the photoresist to the darkening layer, a material of the functional layer comprises a transparent conductive material, silicon nitride, or a metal with a thickness less than a skin depth, and the display panel further comprises a protecting layer covering the functional layer.

In a display panel according to an embodiment of the present disclosure, a thickness of the protecting layer ranges from 900 Å to 3000 Å.

In a display panel according to an embodiment of the present disclosure, a material of the darkening layer comprises one or any combination of metal oxide, metal nitride, metal oxynitride, molybdenum carbide alloy, and tungsten molybdenum alloy.

In a display panel according to an embodiment of the present disclosure, a thickness of the darkening layer ranges from 30 nm to 150 nm and a thickness of the functional layer ranges from 10 nm to 70 nm.

In a display panel according to an embodiment of the present disclosure, the at least one metal layer comprises a copper layer, the darkening layer comprises molybdenum oxide, and the functional layer comprises indium tin oxide, wherein the thickness of the darkening layer ranges from 60 nm to 150 nm and the thickness of the functional layer ranges from 15 nm to 60 nm.

In a display panel according to an embodiment of the present disclosure, the at least one metal layer comprises a copper layer, the darkening layer comprises molybdenum oxide, and the functional layer comprises silicon nitride, wherein the thickness of the darkening layer ranges from 30 nm to 70 nm and the thickness of the functional layer ranges from 10 nm to 50 nm.

In a display panel according to an embodiment of the present disclosure, the at least one metal layer is a gate metal layer or a source drain metal layer.

In a display panel according to an embodiment of the present disclosure, the at least one metal layer comprises two layers, one layer of the metal layer is a gate metal layer and the other layer of the metal layer is a source drain metal layer.

An embodiment of the present disclosure provides a display panel comprising a substrate, at least one metal layer disposed on the substrate, a darkening layer covering the at least one metal layer, and a functional layer covering the darkening layer, wherein an adhesive force of a photoresist to the functional layer is greater than an adhesive force of the photoresist to the darkening layer and an adhesive force of the functional layer to the darkening layer is greater than the adhesive force of the photoresist to the darkening layer.

In a display panel according to an embodiment of the present disclosure, a material of the functional layer comprises a transparent conductive material, silicon nitride, or a metal with a thickness less than a skin depth.

In a display panel according to an embodiment of the present disclosure, the display panel further comprises a protecting layer covering the functional layer.

In a display panel according to an embodiment of the present disclosure, a thickness of the protecting layer ranges from 900 Å to 3000 Å.

In a display panel according to an embodiment of the present disclosure, the transparent conductive material comprises one of indium tin oxide, indium zinc oxide, and indium gallium zinc oxide.

In a display panel according to an embodiment of the present disclosure, a material of the darkening layer comprises one or any combination of metal oxide, metal nitride, metal oxynitride, molybdenum carbide alloy, and tungsten molybdenum alloy.

In a display panel according to an embodiment of the present disclosure, a thickness of the darkening layer ranges from 30 nm to 150 nm and a thickness of the functional layer ranges from 10 nm to 70 nm.

In a display panel according to an embodiment of the present disclosure, the at least one metal layer comprises a copper layer, the darkening layer comprises molybdenum oxide, and the functional layer comprises indium tin oxide, wherein the thickness of the darkening layer ranges from 60 nm to 150 nm and the thickness of the functional layer ranges from 15 nm to 60 nm. Alternatively, the thickness of the darkening layer is 70 nm and the thickness of the functional layer is 50 nm.

In a display panel according to an embodiment of the present disclosure, the at least one metal layer comprises a copper layer, the darkening layer comprises molybdenum oxide, and the functional layer comprises silicon nitride, wherein the thickness of the darkening layer ranges from 30 nm to 70 nm and the thickness of the functional layer ranges from 10 nm to 50 nm. Alternatively, the thickness of the darkening layer is 50 nm and the thickness of the functional layer is 20 nm.

In a display panel according to an embodiment of the present disclosure, the at least one metal layer is a gate metal layer or a source drain metal layer.

In a display panel according to an embodiment of the present disclosure, the at least one metal layer comprises two layers, one layer of the metal layer is a gate metal layer and the other layer of the metal layer is a source drain metal layer.

In the display panel provided in the embodiments of the present disclosure, the functional layer is provided on the darkening layer so that the adhesive force of the photoresist to the functional layer is greater than the adhesive force of the photoresist to the darkening layer in the prior art, and the adhesive force of the functional layer to the darkening layer is greater than the adhesive force of the photoresist to the darkening layer in the prior art, during the photoetching process of the metal layer, thereby improving the adhesive force of the photoresist and reducing a peeling risk of the photoresist.

BRIEF DESCRIPTION OF THE SEVERAL VIEWS OF THE DRAWINGS

To describe the technical solutions of the embodiments of the present disclosure more clearly, the following briefly introduces the accompanying drawings used in the description of the embodiments of the present disclosure. The accompanying drawings described below illustrate only some exemplary embodiments of the present disclosure, and persons skilled in the art may derive other drawings from the drawings without making creative efforts.

DESCRIPTION OF SPECIFIC EMBODIMENTS OF THE INVENTION

Figure 1:
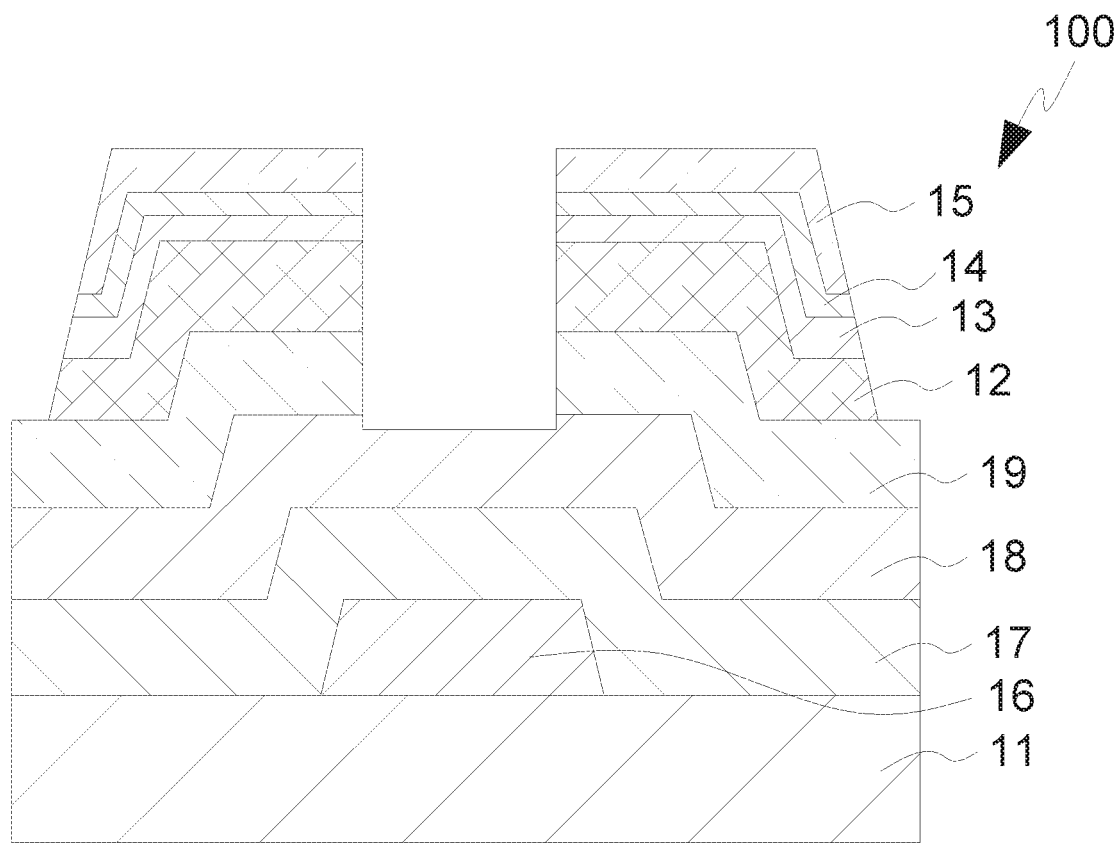
FIG. 1 is a schematic structural diagram illustrating a display panel according to a first embodiment of the present disclosure.

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

In description of the disclosure, it should be understood that orientational or positional relationships represented by directional terms mentioned in the present disclosure, such as central, longitudinal, lateral, length, width, thickness, up, down, front, rear, left, right, vertical, horizontal, top, bottom, inside, outside, clockwise, anticlockwise, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the disclosure, "a plurality of" means two or more than two, unless otherwise specified.

In the present disclosure, it is stated that, unless specified or limited otherwise, the terms "mounted," "connected," "coupled," "fixed" and the like are interpreted broadly, and may be, for example, fixed connections, detachable connections, or integral connections; may also be mechanical or electrical connections; may also be direct connections or indirect connections via intervening structures; may also be inner communications of two elements, which can be understood in the present disclosure by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Please refer to FIG. 1 which is a schematic structural diagram illustrating a display panel according to a first embodiment of the present disclosure.

The embodiment of the present disclosure provides a display panel 100 comprising a substrate 11, at least one metal layer 12, a darkening layer 13, a functional layer 14, and a protecting layer 15.

The at least one metal layer 12 is disposed on the substrate 11, the darkening layer 13 covers the at least one metal layer 12, the functional layer 14 covers the darkening layer 13, and the protecting layer 15 covers the functional layer.

Specifically, in the display panel 100 according to the first embodiment, a number of the metal layer 12 is one and the metal layer 12 is a source drain metal layer 12. Therefore, the display panel 100 also comprises a gate metal layer 16, a first insulation layer 17, an active layer 18, and a second insulation layer 19 arranged on the substrate 11 in sequence. The source drain metal layer 12 (metal layer) is arranged on the second insulation layer 19. The source drain metal layer 12 (metal layer) comprises data lines, sources, and drains.

Wherein an adhesive force of a photoresist to the functional layer 14 is greater than an adhesive force of the photoresist to the darkening layer 13 and an adhesive force of the functional layer 14 to the darkening layer 13 is greater than the adhesive force of the photoresist to the darkening layer 13.

A patterning process of the source drain metal layer 12 (metal layer) according to the first embodiment comprises forming the darkening layer 13 on the source drain metal layer 12 firstly, wherein the darkening layer 13 can be formed by performing sputtering on a corresponding target material through physical vapor deposition or can also be formed by inputting oxygen, nitrogen or carbon dioxide when performing physical vapor deposition on a metal or metal alloy target material, then forming the functional layer 14 on the darkening layer 13, forming the photoresist layer on the function layer 14 and exposing and developing the photoresist layer, and etching the source drain metal layer 12, the darkening layer 13, and the function layer 14 with the patterned photoresist layer as a shield to obtain the patterned source drain metal layer 12.

A process of the source drain metal layer in the prior art comprises forming the darkening layer on the source drain metal layer, then forming the functional layer on the darkening layer, exposing and developing the photoresist layer, and etching the darkening layer and the source drain metal layer to obtain the patterned source drain metal layer. However, a poor adhesive force of the photoresist to the darkening layer will cause the photoresist to peel off during the etching process, thereby affecting a quality of the process.

Therefore, in the first embodiment, the functional layer 14 is added on the basis of prior art, and the adhesive force of the photoresist to the functional layer 14 is greater than the adhesive force of the photoresist to the darkening layer 13 and the adhesive force of the functional layer 14 to the darkening layer 13 is greater than the adhesive force of the photoresist to the darkening layer 13. This configuration improves the adhesive force of the photoresist layer and reduces a peeling risk of the photoresist during the etching process.

Alternatively, a material of the functional layer 14 comprises a transparent conductive material, silicon nitride ($SiN_x$) or a metal with a thickness less than a skin depth, but not limited hereto, wherein the transparent conductive material comprises one or any combination of indium tin oxide (ITO), indium zinc oxide (IZO), and indium gallium zinc oxide (IGZO). When the material of the functional layer 14 comprises the metal, the thickness of the functional layer 14 should be less than the skin depth, so that the functional layer 14 has a property of light transmission, so as to reduce the reflectivity to external light.

In the first embodiment, a thickness of the protecting layer 15 ranges from 900 Å (comprising 900 Å) to 3000 Å (comprising 3000 Å), and the thickness of the protecting layer 15 in the first embodiment is not limited hereto. Alternatively, a material of the protecting layer 15 can comprise silicon nitride ($SiN_x$), silicon oxide ($SiO_x$), or silicon oxynitride ($SiN_xO_y$), but not limited hereto.

In the first embodiment, a material of the darkening layer 13 comprises one or any combination of metal oxide, metal nitride, metal oxynitride, molybdenum carbide alloy, and tungsten molybdenum alloy.

Alternatively, the material of the darkening layer 13 comprises $Mo_aX_bO_cN_d$, $Mo_aX_bW_c$, $Mo_aX_bC_c$, or $Al_aO_bN_c$, wherein a is a rational number greater than 0, b is a rational number greater than or equal to 0, c and d are rational numbers greater than or equal to 0, and X is at least one metal element of tantalum, vanadium, nickel, niobium, zirconium, tungsten, titanium, rhenium, and hafnium. In the first embodiment, the material of the darkening layer 13 is not limited hereto.

Alternatively, $Mo_aX_bO_cN_d$ comprises at least one of O and N and b is a rational number greater than 0, that is, $Mo_aX_bO_cN_d$ is molybdenum oxide alloy, molybdenum nitride alloy, or molybdenum oxynitride alloy. In $Mo_aX_bW_c$, $Mo_aX_bC_c$, and $Al_aO_bN_c$, b and c are rational numbers greater than 0, that is, $Mo_aX_bW_c$ is tungsten molybdenum alloy, $Mo_aX_bC_c$ is molybdenum carbide alloy, and $Al_aO_bN_c$ is aluminum oxynitride.

In the display panel 100 according to the first embodiment, a thickness of the darkening layer 13 ranges from 30 nm (comprising 30 nm) to 150 nm (comprising 150 nm) and the thickness of the functional layer 14 ranges from 10 nm (comprising 10 nm) to 70 nm (comprising 70 nm), wherein the above thicknesses of the darkening layer 13 and the functional layer 14 are restricted to reduce the reflectivity to external light.

Specifically, the metal layer 12 (the source drain metal layer) comprises a copper (Cu) layer, the darkening layer 13 comprises molybdenum oxide ($MoO_x$), and the functional layer 14 comprises indium tin oxide (ITO), that is, a structure in the first embodiment is $Cu+MoO_x+ITO+PV$, wherein the PV is the protecting layer 15. The thickness of the darkening layer 13 ranges from 60 nm (comprising 60 nm) to 150 nm (comprising 150 nm) and the thickness of the functional layer 14 ranges from 15 nm (comprising 15 nm) to 60 nm (comprising 60 nm).

Alternatively, the thickness of the darkening layer 13 is 70 nm and the thickness of the functional layer 14 is 50 nm. In this case, please refer to table 1, a reflectivity of a $Cu+MoO_x+ITO+PV$ structure is very close to that of a $Cu+MoO_x+PV$ structure and a reflectivity of a $Cu+PV$ structure is 48.83%. Therefore, the reflectivity of the $Cu+MoO_x+ITO+PV$ structure in the first embodiment can be reduced from 48.83% to 7.35%.

TABLE 1

| Layer structure | Cu + $MoO_x$ + PV | Cu + $MoO_x$ + ITO + PV | Cu + $MoO_x$ + $SiN_x$ + PV | Cu + PV |
|---|---|---|---|---|
| Reflectivity/% | 7.3 | 7.35 | 7.33 | 48.83 |

Figure 2:
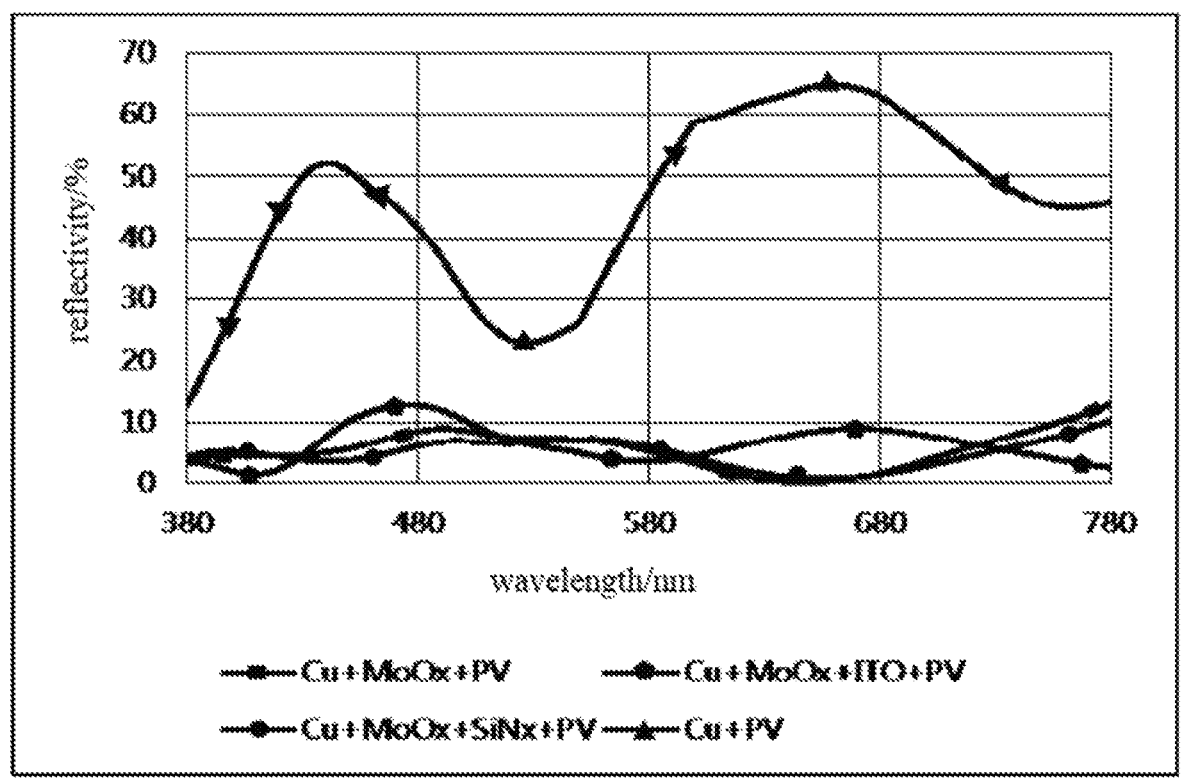
FIG. 2 is a relational diagram illustrating reflectivities of different layer structures at different wavelengths.

Specifically, please refer to FIG. 2 which is a relational diagram illustrating reflectivities of different layer structures in table 1 at different wavelengths. According to FIG. 2, the reflectivities of the $Cu+MoO_x+ITO+PV$ structure in the first embodiment are close to that of the $Cu+MoO_x+PV$ structure at all wavelengths.

Figure 3:
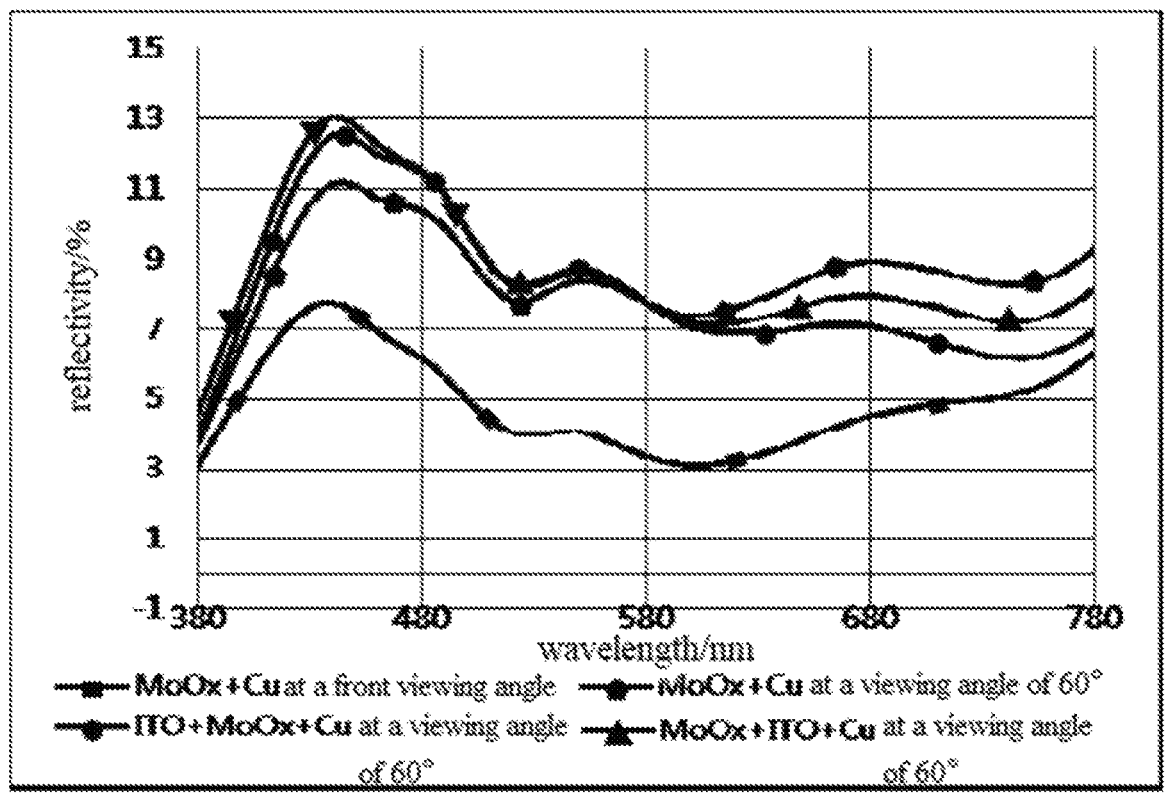
FIG. 3 is a relational diagram illustrating reflectivities of different layer structures at different wavelengths and wide viewing angels.

Refer to FIG. 3 which is a relational diagram illustrating reflectivities of different layer structures in table 1 at different wavelengths and wide viewing angels. According to FIG. 3, the reflectivities of the $Cu+MoO_x+ITO+PV$ structure in the first embodiment are close to that of the $Cu+MoO_x+PV$ structure at all wavelengths and wide viewing angles.

Therefore, according to FIG. 2 and FIG. 3, the $Cu+MoO_x+ITO+PV$ structure in the first embodiment is similar to the $Cu+MoO_x+PV$ structure in the prior art in terms of reflectivity. Therefore, the functional layer 14 added in the first embodiment not only improves the adhesive force of the photoresist, but also guarantees an effect of reducing reflectivity.

Alternatively, the metal layer 12 (the source drain metal layer) comprises a copper (Cu) layer, the darkening layer 13 comprises molybdenum oxide ($MoO_x$), and the functional layer 14 comprises silicon nitride ($SiN_x$), that is, a structure in the first embodiment is Cu+$MoO_x$+$SiN_x$+PV, wherein the PV is the protecting layer 15. The thickness of the darkening layer 13 ranges from 30 nm (comprising 30 nm) to 70 nm (comprising 70 nm) and the thickness of the functional layer 14 ranges from 10 nm (comprising 10 nm) to 50 nm (comprising 50 nm).

Alternatively, the thickness of the darkening layer 13 is 50 nm and the thickness of the functional layer 14 is 20 nm. In this case, please refer to table 1, a reflectivity of a Cu+$MoO_x$+$SiN_x$+PV structure is very close to that of a Cu+$MoO_x$+PV structure and a reflectivity of a Cu+PV structure is 48.83%. Therefore, the reflectivity of the Cu+$MoO_x$+$SiN_x$+PV structure in the first embodiment can be reduced from 48.83% to 7.33%.

Specifically, please refer to FIG. 2 which is a relational diagram illustrating reflectivities of different layer structures in table 1 at different wavelengths. According to FIG. 2, the reflectivities of the Cu+$MoO_x$+$SiN_x$+PV structure in the first embodiment are close to that of the Cu+$MoO_x$+PV structure at all wavelengths.

Please refer to FIG. 3 which is a relational diagram illustrating reflectivities of different layer structures in table 1 at different wavelengths and wide viewing angels. According to FIG. 3, the reflectivities of the Cu+$MoO_x$+$SiN_x$+PV structure in the first embodiment are close to that of the Cu+$MoO_x$+PV structure at all wavelengths and wide viewing angles.

Therefore, according to FIG. 2 and FIG. 3, the Cu+$MoO_x$+$SiN_x$+PV structure in the first embodiment is similar to the Cu+$MoO_x$+PV structure in the prior art in terms of reflectivity. Therefore, the functional layer 14 added in the first embodiment not only improves the adhesive force of the photoresist, but also guarantees an effect of reducing reflectivity.

While the first embodiment only recites the examples of above two structures, it is not limited hereto.

Figure 4:
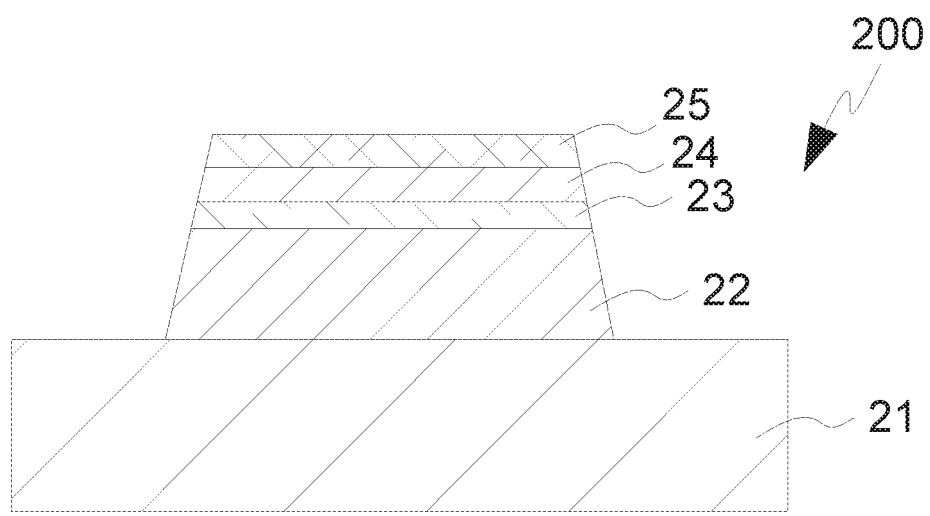
FIG. 4 is a schematic structural diagram illustrating a display panel according to a second embodiment of the present disclosure.

As shown in FIG. 4, a display panel 200 in a second embodiment differs from the display panel 100 in the first embodiment in that a number of the metal layer 22 is one and the metal layer 22 is the gate metal layer.

Therefore, the display panel 200 comprises the gate metal layer 22, the darkening layer 23, the functional layer 24, and the protecting layer 25 arranged on the substrate 21 in sequence. The gate metal layer 22 (metal layer) comprises scan lines and gates.

In the display panel 200 in the second embodiment, structures and combination structures of the darkening layer 23, the functional layer 24, and the protecting layer 25 are similar to or same as that of the darkening layer 23, the functional layer 24, and the protecting layer 25 in the display panel 100 in the first embodiment. Reference may be made to the display panel 100 in the description in the first embodiment and details are not further described herein.

In some embodiments, the metal layer 22 comprises two layers, one layer of the metal layer is a gate metal layer and the other layer of the metal layer is a source drain metal layer, wherein the darkening layer, the functional layer, and the protecting layer are respectively arranged on the gate metal layer and the source drain metal layer. In the embodiment, the structure of the darkening layer, the functional layer, and the protecting layer arranged on the gate metal layer is similar to or same as that in the second embodiment, and please refer to the description of the second embodiment for details. In the embodiment, the structure of the darkening layer, the functional layer, and the protecting layer arranged on the source drain metal layer is similar to or same as that in the first embodiment, and please refer to the description of the first embodiment for details which are not further described herein.

In the display panel provided in the embodiments of the present disclosure, the functional layer is provided on the darkening layer so that the adhesive force of the photoresist to the functional layer is greater than the adhesive force of the photoresist to the darkening layer in the prior art, and the adhesive force of the functional layer to the darkening layer is greater than the adhesive force of the photoresist to the darkening layer in the prior art, during the photoetching process of the metal layer, thereby improving the adhesive force of the photoresist and reducing a peeling risk of the photoresist.

The display panel provided in the embodiments of the present disclosure is described in detail above. The principle and implementations of the present disclosure are described in this specification by using specific examples. The description about the foregoing embodiments is merely provided to help understand the method and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A display panel, comprising:
a substrate;
at least one metal layer disposed on the substrate;
a darkening layer covering the at least one metal layer; and
a light transmissible functional layer covering the darkening layer;
wherein an adhesive force of a photoresist to the light transmissible functional layer is greater than an adhesive force of the photoresist to the darkening layer, and an adhesive force of the light transmissible functional layer to the darkening layer is greater than the adhesive force of the photoresist to the darkening layer;
a material of the light transmissible functional layer comprises a transparent conductive material, silicon nitride, or a metal; and
the display panel further comprises a protecting layer covering the light transmissible functional layer:,
wherein a thickness of the darkening layer ranges from 30 nm to 150 nm and a thickness of the light transmissible functional layer ranges from 10 nm to 70 nm;
wherein the at least one metal layer comprises two layers, one layer of the metal layer is a gate metal layer and the other layer of the metal layer is a source drain metal layer.

2. The display panel as claimed in claim 1, wherein a thickness of the protecting layer ranges from 900 Å to 3000 Å.

3. The display panel as claimed in claim 1, wherein a material of the darkening layer comprises one or any combination of metal oxide, metal nitride, metal oxynitride, molybdenum carbide alloy, and tungsten molybdenum alloy.

4. The display panel as claimed in claim 1, wherein the at least one metal layer comprises a copper layer, the darkening layer comprises molybdenum oxide, and the light transmissible functional layer comprises indium tin oxide, and wherein the thickness of the darkening layer ranges from 60 nm to 150 nm and the thickness of the light transmissible functional layer ranges from 15 nm to 60 nm.

5. The display panel as claimed in claim 1, wherein the at least one metal layer comprises a copper layer, the darkening layer comprises molybdenum oxide, and the light transmissible functional layer comprises silicon nitride, the thickness of the darkening layer ranges from 30 nm to 70 nm and the thickness of the light transmissible functional layer ranges from 10 nm to 50 nm.

6. A display panel, comprising:
a substrate;
at least one metal layer disposed on the substrate;
a darkening layer covering the at least one metal layer; and
a light transmissible functional layer covering the darkening layer; and
a protecting layer covering the light transmissible functional layer;
wherein an adhesive force of a photoresist to the light transmissible functional layer is greater than an adhesive force of the photoresist to the darkening layer, and an adhesive force of the light transmissible functional layer to the darkening layer is greater than the adhesive force of the photoresist to the darkening layer;
wherein a thickness of the darkening layer ranges from 30 nm to 150 nm and a thickness of the light transmissible functional layer ranges from 10 nm to 70 nm:,
wherein the at least one metal layer comprises two layers, one layer of the metal layer is a gate metal layer and the other layer of the metal layer is a source drain metal layer.

7. The display panel as claimed in claim 6, wherein a material of the light transmissible functional layer comprises a transparent conductive material, silicon nitride, or a metal.

8. The display panel as claimed in claim 6, wherein a thickness of the protecting layer ranges from 900 Å to 3000 Å.

9. The display panel as claimed in claim 6, wherein a material of the darkening layer comprises one or any combination of metal oxide, metal nitride, metal oxynitride, molybdenum carbide alloy, and tungsten molybdenum alloy.

10. The display panel as claimed in claim 6, wherein the at least one metal layer comprises a copper layer, the darkening layer comprises molybdenum oxide, and the light transmissible functional layer comprises indium tin oxide, and wherein the thickness of the darkening layer ranges from 60 nm to 150 nm and the thickness of the light transmissible functional layer ranges from 15 nm to 60 nm.

11. The display panel as claimed in claim 6, wherein the at least one metal layer comprises a copper layer, the darkening layer comprises molybdenum oxide, and the light transmissible functional layer comprises silicon nitride, and wherein the thickness of the darkening layer ranges from 30 nm to 70 nm and the thickness of the light transmissible functional layer ranges from 10 nm to 50 nm.

* * * * *